United States Patent
Iwata et al.

(10) Patent No.: US 11,849,646 B2
(45) Date of Patent: *Dec. 19, 2023

(54) NITRIDE CAPPING LAYER FOR SPIN TORQUE TRANSFER (STT) MAGNETORESISTIVE RANDOM ACCESS MEMORY (MRAM)

(71) Applicant: Taiwan Semiconductor Manufacturing Company, Ltd., Hsin-Chu (TW)

(72) Inventors: Jodi Mari Iwata, San Carlos, CA (US); Guenole Jan, San Jose, CA (US); Ru-Ying Tong, Los Gatos, CA (US); Vignesh Sundar, Sunnyvale, CA (US); Jian Zhu, San Jose, CA (US); Huanlong Liu, Sunnyvale, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/873,428

(22) Filed: Jul. 26, 2022

(65) Prior Publication Data

US 2022/0384716 A1    Dec. 1, 2022

Related U.S. Application Data

(63) Continuation of application No. 16/877,066, filed on May 18, 2020, now Pat. No. 11,417,835, which is a
(Continued)

(51) Int. Cl.
*H10N 50/10* (2023.01)
*H10N 50/01* (2023.01)
(Continued)

(52) U.S. Cl.
CPC .......... *H10N 50/10* (2023.02); *H01F 10/3286* (2013.01); *H01F 41/302* (2013.01);
(Continued)

(58) Field of Classification Search
CPC ........ H10N 50/10; H10N 50/80; H10N 50/01; H10N 50/85; H01F 10/3286; H01F 41/302; G11C 11/161
(Continued)

(56) References Cited

U.S. PATENT DOCUMENTS 6,166,948 A    12/2000   Parkin et al.
6,743,503 B1   6/2004    Chen
(Continued)

FOREIGN PATENT DOCUMENTS

CN    102456830 A    5/2012
CN    105990517 A    10/2016
(Continued)

OTHER PUBLICATIONS

Slonczewski, J.C., "Current-driven excitation of magnetic multilayers", Journal of Magnetism and Magnetic Materials 159, L-1-L-7, Elsevier, Jun. 1996.
(Continued)

*Primary Examiner* — Igwe U Anya
(74) *Attorney, Agent, or Firm* — HAYNES AND BOONE, LLP

(57) ABSTRACT

A magnetic tunnel junction (MTJ) is disclosed wherein first and second interfaces of a free layer (FL) with a first metal oxide (Hk enhancing layer) and second metal oxide (tunnel barrier), respectively, produce perpendicular magnetic anisotropy (PMA) to increase thermal stability. In some embodiments, a capping layer that is a conductive metal nitride such as MoN contacts an opposite surface of the Hk enhancing layer with respect to the first interface to reduce
(Continued)

interdiffusion of oxygen and nitrogen compared with a TiN capping layer and maintain an acceptable resistance×area (RA) product. In other embodiments, the capping layer may comprise an insulating nitride such as AlN that is alloyed with a conductive metal to minimize RA. Furthermore, a metallic buffer layer may be inserted between the capping layer and Hk enhancing layer. As a result, electrical shorts are reduced and the magnetoresistive ratio is increased.

20 Claims, 7 Drawing Sheets

Related U.S. Application Data continuation of application No. 15/881,035, filed on Jan. 26, 2018, now Pat. No. 10,665,773.

(51) Int. Cl.
H10N 50/80 (2023.01)
H10N 50/85 (2023.01)
H01F 10/32 (2006.01)
H01F 41/30 (2006.01)
G11C 11/16 (2006.01)

(52) U.S. Cl.
CPC ............ G11C 11/161 (2013.01); H10N 50/01 (2023.02); H10N 50/80 (2023.02); H10N 50/85 (2023.02)

(58) Field of Classification Search
USPC .......................................................... 257/421
See application file for complete search history.

(56) References Cited

U.S. PATENT DOCUMENTS

| | | | |
|---|---|---|---|
| 6,834,005 B1 | 12/2004 | Parkin | |
| 6,847,510 B2 | 1/2005 | Childress et al. | |
| 6,974,708 B2 | 12/2005 | Horng et al. | |
| 7,183,120 B2 | 2/2007 | Berg et al. | |
| 7,335,961 B2 | 2/2008 | Guo et al. | |
| 7,486,551 B1 | 2/2009 | Li et al. | |
| 7,586,781 B2 | 9/2009 | Saitoh et al. | |
| 7,630,232 B2 | 12/2009 | Guo | |
| 7,742,263 B2 | 6/2010 | Fukumoto et al. | |
| 7,817,462 B2 | 10/2010 | Miura et al. | |
| 7,863,060 B2 | 1/2011 | Belen et al. | |
| 7,902,579 B2 | 3/2011 | Lim et al. | |
| 7,936,627 B2 | 5/2011 | Fukami | |
| 8,009,464 B2 | 8/2011 | Kajiyama | |
| 8,379,429 B2 | 2/2013 | Ishiwata et al. | |
| 8,470,462 B2 | 6/2013 | Horng et al. | |
| 8,580,583 B2 | 11/2013 | Lee et al. | |
| 8,592,927 B2 | 11/2013 | Jan et al. | |
| 8,921,961 B2 | 12/2014 | Kula et al. | |
| 9,006,704 B2 | 4/2015 | Jan et al. | |
| 9,048,411 B2 | 6/2015 | Jan et al. | |
| 9,368,551 B2 | 6/2016 | Masuoka et al. | |
| 9,425,387 B1 * | 8/2016 | Liu | H10N 50/10 |
| 9,614,258 B2 | 4/2017 | Takahashi et al. | |
| 9,711,202 B2 | 7/2017 | Kim et al. | |
| 9,773,972 B1 | 9/2017 | Kim et al. | |
| 10,014,465 B1 | 7/2018 | Liu et al. | |
| 10,665,773 B2 * | 5/2020 | Iwata | H10N 50/10 |
| 2004/0252539 A1 | 12/2004 | Parkin | |
| 2007/0253122 A1 | 11/2007 | Fukuzawa et al. | |
| 2008/0137405 A1 | 6/2008 | Ohno et al. | |
| 2008/0204946 A1 | 8/2008 | Ochiai et al. | |
| 2009/0213503 A1 | 8/2009 | Sun et al. | |
| 2009/0257151 A1 | 10/2009 | Zhang et al. | |
| 2009/0303779 A1 | 12/2009 | Chen et al. | |
| 2010/0020592 A1 | 1/2010 | Hosotani et al. | |
| 2010/0072524 A1 | 3/2010 | Huai et al. | |
| 2010/0090261 A1 | 4/2010 | Zheng et al. | |
| 2011/0014500 A1 | 1/2011 | Horng et al. | |
| 2012/0023386 A1 | 1/2012 | Oh et al. | |
| 2012/0205758 A1 | 8/2012 | Jan et al. | |
| 2012/0280336 A1 | 11/2012 | Jan et al. | |
| 2013/0221459 A1 | 8/2013 | Jan et al. | |
| 2013/0221460 A1 | 8/2013 | Jan et al. | |
| 2014/0355152 A1 | 12/2014 | Park et al. | |
| 2016/0072043 A1 | 3/2016 | Park et al. | |
| 2016/0211442 A1 | 7/2016 | Cao et al. | |
| 2016/0284763 A1 | 9/2016 | Tahmasebi et al. | |
| 2017/0084836 A1 | 3/2017 | Kim et al. | |
| 2018/0005746 A1 | 1/2018 | Thomas et al. | |
| 2018/0026182 A1 | 1/2018 | Kim et al. | |
| 2019/0109277 A1 | 4/2019 | Jan et al. | |

FOREIGN PATENT DOCUMENTS

| | | |
|---|---|---|
| CN | 107611256 A | 1/2018 |
| JP | H 11337527 | 12/1999 |
| JP | 2005150303 | 6/2005 |
| JP | 2007123640 | 5/2007 |
| KR | 20130108485 A | 10/2013 |
| KR | 20180007172 A | 1/2018 |
| WO | WO 2007015474 | 2/2007 |
| WO | WO 2009101827 | 8/2009 |
| WO | 2010144836 A1 | 12/2010 |
| WO | 2017135767 A1 | 8/2017 |

OTHER PUBLICATIONS

Ikeda, S., "A perpendicular-anisotropy CoFeB—MgO magnetic tunnel junction", Nature Materials, Published online: Jul. 11, 2010/ DOI: 10-1038/NMAT2804, www.nature.com/naturematerials, pp. 1-4.

Fukami, S., et al., "Current-induced domain wall motion in perpendicularly magnetized CoFeB nanowire", Applied Physics Letters 98, 082504 (2011), Feb. 2011, doi: http://dx.doi.org/10.1063/1.3558917, pp. 1-3.

Klaua, M., et al., "Growth, structure, electroic and magnetic properties of MgO/Fe(0011) bilayers and Fe/MgO/Fe(001) trilayers", Physical Review B, vol. 64, 134411, Sep. 2001, pp. 1-8.

German Patent file reference 11 2019 000 198.1, German Intellectual Property Office, Examination search report, dated Feb. 27, 2023.

* cited by examiner

| Element | Oxide | Free energy of formation per mol of $O_2$ ($\times 10^{-6}$ J.kmol$^{-1}$) |
|---|---|---|
| Au | $Au_2O_3$ | 109 |
| Ag | $Ag_2O_3$ | -7 |
| Ru | $RuO_2$ | -253 |
| Cu | CuO | -254 |
| Co | CoO | -426 |
| Ni | NiO | -432 |
| Fe | FeO | -488 |
| Fe | $Fe_2O_3$ | -495 |
| Mo | $MoO_2$ | -502 |
| W | $WO_3$ | -509 |
| Sn | SnO | -514 |
| Zn | ZnO | -636 |
| Cr | $Cr_2O_3$ | -699 |
| Nb | $Nb_2O_5$ | -708 |
| Ta | $Ta_2O_5$ | -788 |
| B | $B_2O_3$ | -796 |
| Si | $SiO_2$ | -805 |
| Mn | $Mn_2O_3$ | -854 |
| Ti | $TiO_2$ | -890 |
| Zr | $ZrO_2$ | -1037 |
| Al | $Al_2O_3$ | -1053 |
| Ba | BaO | -1056 |
| Hf | $HfO_2$ | -1084 |
| Mg | MgO | -1146 |
| Ca | CaO | -1208 |

*FIG. 10*

NITRIDE CAPPING LAYER FOR SPIN TORQUE TRANSFER (STT) MAGNETORESISTIVE RANDOM ACCESS MEMORY (MRAM)

PRIORITY DATA

The present application is a continuation of U.S. application Ser. No. 16/877,066, filed May 18, 2020, which is a continuation of U.S. application Ser. No. 15/881,035, filed Jan. 26, 2018, each of which is incorporated by reference herein in its entirety.

RELATED PATENT APPLICATION

This application is related to the following: U.S. application Ser. No. 15/461,779, filed Mar. 17, 2017 and U.S. application Ser. No. 15/728,818, filed Oct. 10, 2017 each of which are assigned to a common assignee and herein incorporated by reference in their entirety.

TECHNICAL FIELD

The present disclosure relates to a magnetic element comprised of a free layer that interfaces with a tunnel barrier layer and a Hk enhancing layer, and with a nitride capping layer to prevent oxygen diffusion out of the Hk enhancing layer, and to minimize metal and nitrogen diffusion through the Hk enhancing layer to the free layer thereby maintaining an acceptable magnetoresistive ratio (DRR), and lowering the resistance×area (RA) product when the capping layer is conductive.

BACKGROUND

MRAM, which is based on the integration of silicon CMOS (complementary metal on semiconductor) with magnetic tunnel junction (MTJ) technology, is a major emerging technology that is highly competitive with existing semiconductor memories such as SRAM, DRAM, and Flash. Furthermore, spin-transfer torque (STT) magnetization switching described by J. C. Slonczewski in "Current driven excitation of magnetic multilayers", J. Magn. Magn. Mater. V 159, L1-L7 (1996), has led to the development of spintronic devices such as STT-MRAM on a gigabit scale.

Both field-MRAM and STT-MRAM have a MTJ element based on a tunneling magnetoresistance (TMR) effect wherein a stack of layers has a configuration in which two ferromagnetic (FM) layers are separated by a thin non-magnetic dielectric layer. One of the FM layers is a pinned layer having a magnetic moment that is fixed in a first direction while the other FM layer is called a free layer (FL) and has a magnetic moment that is free to rotate in a direction parallel (P state) or anti-parallel (AP state) to the first direction corresponding to a "0" or "1" magnetic state, respectively. Compared with conventional MRAM, STT-MRAM has an advantage in avoiding the half select problem and writing disturbance between adjacent cells. The spin-transfer effect arises from the spin dependent electron transport properties of ferromagnetic-spacer-ferromagnetic multilayers. When a spin-polarized current traverses a magnetic multilayer in a current perpendicular to plane (CPP) direction, the spin angular momentum of electrons incident on a FM layer interacts with magnetic moments of the FM layer near the interface between the FM layer and non-magnetic spacer. Through this interaction, the electrons transfer a portion of their angular momentum to the FL. As a result, spin-polarized current can switch the magnetization direction of the FL if the current density is sufficiently high, and if the dimensions of the multilayer are small.

P-MTJs are MTJ cells with perpendicular magnetic anisotropy (PMA) in the pinned layer and FL, and are the building blocks that enable STT-MRAM and other spintronic devices. Typically, there is a non-magnetic tunneling oxide layer called a tunnel barrier layer between the pinned layer and FL. When the FL has PMA, the critical current ($i_c$) needed to switch the FL and p-MTJ from a P state to an AP state, or vice versa, is directly proportional to the perpendicular anisotropy field as indicated in equation (1) where e is the electron charge, □ is a Gilbert damping constant, Ms is the FL saturation magnetization, h is the reduced Plank's constant, g is the gyromagnetic ratio, and $H_{k_{\mathit{eff}},\perp}$ is the out-of-plane anisotropy field of the magnetic region to switch, and V is the volume of the free layer:

$$i_c = \frac{\alpha e M_S V H_{k_{\mathit{eff}},\perp}}{g\hbar} \quad (1)$$

The value $\Delta = kV/k_BT$ is a measure of the thermal stability of the FL where kV is also known as $E_b$, or the energy barrier between the P and AP magnetic states, $k_B$ is the Boltzmann constant and T is the temperature. Thermal stability is a function of the perpendicular anisotropy field as shown in equation (2):

$$\Delta = \frac{M_S V H_{k_{\mathit{eff}},\perp}}{2 k_B T} \quad (2)$$

The perpendicular anisotropy field (Hk) of the FL is expressed in equation (3) as:

$$H_{k_{\mathit{eff}},\perp} = -4\pi M_s + \frac{2K_U^{\perp,s}}{M_s d} + H_{k,\perp} \quad (3)$$

where $M_s$ is the saturation magnetization, d is the thickness of the free layer, $H_{k,\perp}$ is the crystalline anisotropy field in the perpendicular direction, and $K_U^{\perp,s}$ is the surface perpendicular anisotropy of the top and bottom surfaces of the FL. Since the FL must be able to withstand 400° C. temperatures during annealing processes necessary for CMOS fabrication, this high temperature requirement has led to new p-MTJ designs wherein the FL has greater PMA. One approach to enhancing PMA in a FL is to form a metal oxide interface at top and bottom surfaces thereof. Thus, in addition to a first FL interface with the tunnel barrier layer, a second FL interface is formed with a so-called Hk enhancing layer to generate higher surface perpendicular anisotropy in equation (3).

Since the Hk enhancing layer is usually underoxidized to minimize RA in the p-MTJ cell, there is a tendency for metals or other species from an overlying capping layer or hard mask to migrate through vacant lattice sites in the Hk enhancing layer to the FL and degrade DRR. DRR is expressed as dR/R where dR is the difference in resistance between the P and AP states, and R is the resistance of the P state. Larger DRR means a higher read margin. Moreover, oxygen may migrate out of the Hk enhancing layer, and thereby reduce surface perpendicular anisotropy at the FL/Hk enhancing layer interface, which leads to lower FL thermal stability. Thus, an improved p-MTJ structure is needed to maintain Hk enhancing layer integrity such that FL thermal stability is maintained while providing DRR and RA values required for high magnetic performance in advanced memory designs wherein a critical dimension (FL width) is substantially less than 100 nm.

SUMMARY

One objective of the present disclosure is to provide a p-MTJ wherein there is an improved barrier to migration of metals and other species from a hard mask layer or capping layer through the Hk enhancing layer to the FL in a bottom spin valve structure, and from a seed layer or bottom electrode (BE) through the Hk enhancing layer to the FL in a top spin valve structure.

A second objective is to provide an improved barrier according to the first objective wherein the barrier also substantially minimizes oxygen diffusion out of the Hk enhancing layer to a capping layer/hard mask or to a seed layer/BE.

A third objective is to provide a method of forming the p-MTJ according to the first two objectives with a process flow that is compatible with CMOS fabrication.

According to one embodiment, these objectives are achieved by providing a nitride or oxynitride capping layer that serves as a barrier between a Hk enhancing layer and a hard mask in a p-MTJ with a bottom spin valve configuration. Thus, an optional seed layer, pinned layer, tunnel barrier layer, FL, Hk enhancing layer, nitride or oxynitride capping layer, and hard mask are sequentially formed on a substrate that may be a bottom electrode (BE). The pinned layer preferably has a synthetic antiparallel (SyAP) configuration wherein an outer AP2 layer contacts the seed layer, or BE in the absence of a seed layer, and an inner AP1 layer adjoins the tunnel barrier layer. Moreover, there is an antiferromagnetic (AF) coupling layer between the AP1 and AP2 layers. Thus, the FL has a first interface with the tunnel barrier layer, and a second interface with the Hk enhancing layer that may be a metal oxide or metal oxynitride.

A key feature of a first embodiment is the capping layer composition which is a metal nitride or metal oxynitride wherein the metal (M1) is selected from Ti, Zr, Hf, V, Nb, Ta, Cr, Mo, and W to afford a conductive nitride (M1N) or oxynitride (M1ON) that is beneficial in minimizing RA compared with a corresponding metal oxide. Furthermore, a dusting layer that serves as a metallic buffer may be inserted between the Hk enhancing layer and the conductive nitride or oxynitride capping layer to reduce interdiffusion that is associated with a Hk enhancing layer/M1N interface or Hk enhancing layer/M1ON interface. Preferably, the dusting layer is one or more of the M1 metals Ti, V, Cr, Zr, Nb, Mo, Hf, Ta, or W.

According to a second embodiment, the capping layer may be comprised of an insulating metal (M2) nitride or oxynitride where M2 is one of B, Al, Si, Ga, In, or Tl that is alloyed with a conductive metal or alloy (M3) selected from one or more of Pt, Au, Ag, Mg, Ca, Sr, Ba, Sc, Y, La, Co, Fe, Mn, Ru, Rh, Jr, Ni, Pd, Zn, Cu, Ti, V, Cr, Zr, Nb, Mo, Hf, Ta, and W to impart conductivity to the resulting M2M3 nitride (M2M3N), or M2M3 oxynitride (M2M3ON). A dusting (buffer) layer made of one or more of the M1 metals may be provided between the Hk enhancing layer and the M2M3N or M2M3ON capping layer.

According to a third embodiment, the capping layer is comprised of an insulating M2 nitride or M2 oxynitride in which conductive pathways are formed that contact the Hk enhancing layer and hard mask. Preferably, the conductive pathways are made of one or more of the M3 metals described previously. Moreover, a M1 dusting layer may be included between the Hk enhancing layer and capping layer.

The present disclosure also encompasses p-MTJ structures having a top spin valve configuration wherein an optional seed layer, nitride or oxynitride barrier layer, Hk enhancing layer, FL, tunnel barrier layer, pinned layer, and hard mask are sequentially formed on a substrate. The nitride or oxynitride barrier layer may have a composition that is M1N or M1ON, M2M3N or M2M3ON, or a composite with M3 conductive pathways formed in a M2N or M2ON layer. In each example, a buffer layer may be included between the barrier layer and Hk enhancing layer to prevent interdiffusion at a barrier layer/Hk enhancing layer interface.

The present disclosure also encompasses a method of fabricating a p-MTJ having a metal nitride or metal oxynitride capping layer with a structure according to one of the aforementioned embodiments. Typically, the M1N, M1ON, M2M3N, and M2M3ON layers are sputter deposited in a single step. However, a multistep process may be employed where M1 or M2M3 layers are first sputter deposited, and then a second step involving nitridation or oxynitridation is used to form the nitride or oxynitride, respectively. Formation of M3 conductive paths within a M2N or M2ON layer is accomplished by a sequence of steps of (1) depositing a M3 layer, (2) depositing a M2 layer on the M3 layer, and (3) performing a nitridation or oxynitridation with plasma, or by a first step of ion implantation and a second step that is an anneal process.

BRIEF DESCRIPTION OF THE DRAWINGS

FIG. 10 is a table listing free energy of oxide formation for various metals.

DETAILED DESCRIPTION

The present disclosure is a p-MTJ structure and a method of making the same wherein a barrier layer that is formed between a Hk enhancing layer and hard mask (or seed layer) is responsible for reduced electrical shorts, and higher DRR by substantially minimizing oxygen diffusion out of the Hk enhancing layer, and reducing diffusion of metals or nitrogen through the Hk enhancing layer to an adjoining free layer. The present disclosure relates to p-MTJ structures having bottom spin valve and top spin valve configurations, or a dual spin valve configuration. The p-MTJ may be incorporated in a MRAM, STT-MRAM or another spintronic device such as a spin torque oscillator, spin hall effect device, magnetic sensor, and a biosensor. A thickness of each p-MTJ layer is in a z-axis direction, and the planes of each layer are formed in the x-axis and y-axis directions. The terms "barrier layer" and "capping layer" may be used interchangeably.

In related patent application Ser. No. 15/461,779, we disclosed a MTJ structure wherein a free layer forms a first interface with a first oxide layer (tunnel barrier layer), and a second interface with a second oxide layer (Hk enhancing layer) that is preferably MgO in order to increase PMA and thermal stability. In addition, a TiN barrier layer is inserted between the Hk enhancing layer and overlying hard mask to preserve the integrity of the MgO layer. However, energy dispersive X-ray spectroscopy (EDS) revealed extensive interdiffusion at the MgO/TiN interface indicating oxygen in the TiN layer, and N present in the FL.

In the present disclosure, we disclose an improved barrier layer designed to substantially reduce oxygen diffusion from an Hk enhancing layer and significantly minimize metal or nitrogen diffusion through the Hk enhancing layer into the FL. One important concept that we considered when replacing Ti in a TiN barrier with another metal is that the alternative metal preferably has a lower affinity for oxygen than Ti which is consistent with a lower (less negative) free energy of oxide formation shown in FIG. 10. Secondly, the influence of a metal nitride barrier layer on the Hk enhancing layer and FL may be mitigated to a certain extent by inserting a metallic buffer layer between the Hk enhancing layer and metal nitride/oxynitride barrier layer. Although conductive metal nitride/oxynitride barriers are preferred, an insulating metal nitride/oxynitride may be practical if alloyed with a conductive metal, or if conductive pathways are formed through the insulating barrier matrix.

Figure 1:
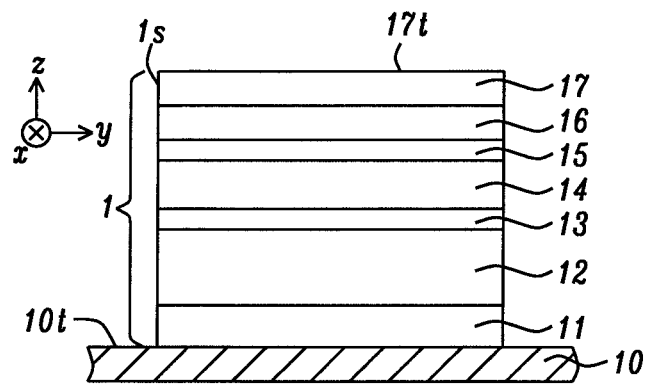
FIG. 1 is a cross-sectional view showing a magnetic tunnel junction (p-MTJ) comprised of a nitride capping layer between a Hk enhancing layer and hard mask according to a first embodiment of the present disclosure.

Referring to FIG. 1, a first embodiment of the present disclosure is depicted in the form of a p-MTJ 1 having a bottom spin valve configuration wherein an optional seed layer 11, pinned layer 12, tunnel barrier layer 13, FL 14, Hk enhancing layer 15, metal nitride or oxynitride capping layer 16, and hard mask 17 are sequentially formed on a substrate 10. In some embodiments, the substrate may be a bottom electrode (BE) in a STT-MRAM or another spintronic device. The BE is typically embedded in an insulation layer (not shown) and is electrically connected to a bit line or word line (not shown) that is driven by an underlying transistor.

Seed layer 11 is a single layer or multilayer and may be comprised of one or more of NiCr, Ta, Ru, Ti, TaN, Cu, Mg, or other materials typically employed to promote a smooth and uniform grain structure in overlying layers. Pinned layer 12 may have a SyAP configuration represented by AP2/AFC layer/AP1 where an AF coupling (AFC) layer made of Ru, Rh, or Ir, for example, is sandwiched between an AP2 magnetic layer and an AP1 magnetic layer (not shown). The AP2 layer contacts the seed layer (or BE) while the AP1 layer adjoins the tunnel barrier layer 13. AP1 and AP2 layers may be comprised of CoFe, CoFeB, Co, or a combination thereof. In other embodiments, the pinned layer may be a laminated stack with inherent PMA such as $(Co/Ni)_n$, $(CoFe/Ni)_n$, $(Co/NiFe)_n$, $(Co/Pt)_n$, $(Co/Pd)_n$, or the like where n is the lamination number. Furthermore, a transitional layer such as CoFeB or Co may be inserted between the uppermost layer in the laminated stack and the tunnel barrier layer.

In a preferred embodiment, tunnel barrier layer 13 is MgO that is formed by sputter depositing a MgO target, or by depositing one or more Mg layers and then oxidizing one or more Mg layers with a known radical oxidation (ROX) or natural oxidation (NOX) method. However, other metal oxides, or metal oxynitrides known in the art may be employed with or instead of MgO. For example, the tunnel barrier may be comprised of $Al_2O_3$, MgAlO, TiOx, AlTiO, MgZnO, $Al_2O_3$, ZnO, ZrOx, HfOx, or MgTaO. The present disclosure also anticipates that the tunnel barrier may be a lamination of one or more of the aforementioned metal oxides.

FL 14 has a thickness from 5 to 30 Angstroms and is a single layer or a multilayer that is one or more of Co, Fe, CoFe, CoFeB, CoB, and FeB, or alloys thereof including CoFeNi and CoFeNiB wherein the Fe content is greater than 50 atomic % (iron rich) of the total content of magnetic elements/constituents. For example, in a $Co_{(100-X)}Fe_xB$ free layer, x is greater than 50 atomic %. In other embodiments, the FL may be comprised of a material with a high crystalline anisotropy energy constant (Ku) having inherent PMA including Heusler alloys, ordered $L1_0$ or $L1_1$ materials, and rare-earth alloys. Heusler alloys include $Ni_2MnZ$, $Pd_2MnZ$, $Co_2MnZ$, $Fe_2MnZ$, $Co_2FeZ$, $Mn_3Ge$, $Mn_2Ga$, and the like where Z is one of Si, Ge, Al, Ga, In, Sn, and Sb. Ordered $L1_0$ or $L1_1$ materials have a composition such as MnAl, MnGa, and RT wherein R is Rh, Pd, Pt, Jr, or an alloy thereof, and T is Fe, Co, Ni or an alloy thereof. Rare-earth alloys include but are not limited to TbFeCo, GdCoFe, FeNdB, and SmCo.

As a result of this configuration where a tunnel barrier (metal oxide) 13 and Hk enhancing layer (metal oxide) 15 form an interface with bottom and top surfaces, respectively, of FL 14, there is strong perpendicular surface anisotropy, $K_{U1}^{\perp,S}$ and $K_{U2}^{\perp,S}$ at the first and second interfaces, respectively, that contribute to enhancing the term $K_U^{\perp,S}$ in equation (3) mentioned earlier.

According to one embodiment, Hk enhancing layer 15 is a metal oxide or metal oxynitride layer having a thickness and oxidation state that are controlled to give a RA product smaller than that of a MgO layer in tunnel barrier layer 13 in order to minimize a decrease in DRR. Thus, the Hk enhancing layer may be a single layer that is an oxide or oxynitride of one or more of Mg, Si, Ti, Ba, Ca, La, Al, Mn, V, and Hf. Moreover, the Hk enhancing layer may be a laminated layer comprised of one or more of the metal oxides or oxynitrides described above. In all embodiments, the Hk enhancing layer may have stoichiometric or non-stoichiometric oxygen content. Stoichiometric is defined as an oxidation state where essentially all non-metal lattice sites in a metal oxide are occupied by oxygen while in a non-stoichiometric oxidation state there are a plurality of unoccupied lattice sites.

A key feature of MTJ 1 is that capping layer 16 has a metal nitride or metal oxynitride composition. According to a first embodiment, the capping layer comprises a metal or alloy (M1) where the metal or alloy is preferably one or more of Ti, Zr, Hf, V, Nb, Ta, Cr, Mo, and W to afford a conductive nitride (M1N) or oxynitride (M1ON) to minimize a RA contribution to the p-MTJ. Note that the total RA value for the p-MTJ is determined by a contribution from each of the metal oxide and metal nitride/oxynitride layers and is represented by the equation $RA_{TOTAL}=(RA_{13}+RA_{15}+RA_{16})$ where $RA_{13}$, $RA_{15}$, and $RA_{16}$ are the RA product for the tunnel barrier layer, Hk enhancing layer, and capping layer, respectively. Preferably, $RA_{TOTAL}$ is <5 ohm-um$^2$ for optimum p-MTJ performance. Since the largest contribution to the total is from the tunnel barrier layer, and the Hk enhancing layer is often underoxidized to avoid exceeding the desired $RA_{TOTAL}$, $RA_{16}$ should provide the smallest RA contribution and is ideally proximate to zero.

The capping layer is advantageously used as a barrier to oxygen migration out of the adjoining Hk enhancing layer 15, and preferably has a thickness from 5 to 100 Angstroms. In other embodiments, the capping layer may be up to 500 Angstroms thick. Accordingly, the metal or alloy M1 should have an affinity for oxygen that is less than that of Mg since MgO is preferably selected for the Hk enhancing layer. Preferably, M1 should be one or more of the elements listed in FIG. 10 that have a less negative free energy of oxide formation than Mg. More preferably, M1 should have a less negative free energy of oxide formation than Ti since a Ti buffer layer adjoining the Hk enhancing layer was found to decrease DRR, which was attributed to oxygen gettering from the Hk enhancing layer.

A M1N capping layer may be formed by sputter depositing a M1 target in a reactive environment comprised of N and Ar species where the term "species" is defined as an ion or radical. The M1N (or M1ON) layer may have a non-stoichiometric nitridation state wherein the metal nitride matrix has vacant sites not occupied by M1 or N atoms. Accordingly, we have found substantial PMA in the FL 14 when a MoN capping layer is deposited with a Ar:N flow rate ratio between 0.6:1 (for higher N content in MoN) and 5:1 (for lower N content in MoN) to give a FL/MgO/MoN stack for the FL, Hk enhancing layer 15, and capping layer 16.

It is also important that nitrogen migration is minimized from the capping layer through the Hk enhancing layer and into FL 14 so that DRR is not degraded. In particular, nitrogen migration from the M1N or M1ON capping layer should be less than from an equivalent thickness of TiN. As mentioned earlier, we found nitrogen does migrate into the FL in a p-MTJ comprised of a FL/MgO/TiN stack where MgO is the Hk enhancing layer and TiN is the capping layer. The aforementioned M1 metals and alloys are believed to offer an improvement in this regard.

Alternatively, capping layer 16 may be comprised of an insulating metal (M2) nitride or oxynitride where M2 is one of B, Al, Si, Ga, In, or Tl that is alloyed with a conductive metal or alloy (M3) selected from one or more of Pt, Au, Ag, Mg, Ca, Sr, Ba, Sc, Y, La, Co, Fe, Mn, Ru, Rh, Ir, Ni, Pd, Zn, Cu, Ti, V, Cr, Zr, Nb, Mo, Hf, Ta, and W to impart conductivity to the resulting M2M3 nitride (M2M3N), or M2M3 oxynitride (M2M3ON). The M2M3N or M2M3ON layers may be formed by sputter depositing M2 and M3 targets in reaction chamber with a plasma generated using a flow of N2 and RIE conditions, or by sputtering a M2M3 alloy, if available, in the presence of nitrogen plasma.

Hard mask 17 may contain one or more layers. For example, the hard mask may be a single layer of Ta or Ru, or have a Ru/Ta or Ru/Ta/Ru configuration. However, the present disclosure is not limited to a particular configuration, which means that other hard mask materials used in the art are acceptable. Generally, the hard mask serves as a RIE or IBE etch mask during patterning of the p-MTJ, and also functions as a barrier to a chemical mechanical polish (CMP) step that is typically employed to planarize an encapsulation layer for insulating p-MTJ cells.

Figure 2:
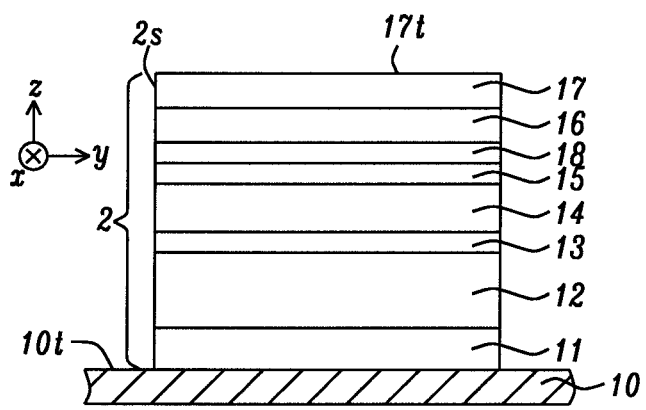
FIG. 2 is a cross-sectional view showing a p-MTJ comprised of a stack with a lower buffer layer and upper nitride capping layer between a Hk enhancing layer and hard mask according to a second embodiment of the present disclosure.

According to a second embodiment of the present disclosure depicted in FIG. 2 and shown as p-MTJ 2, nitrogen migration from capping layer 16 to FL 14 may be further reduced by inserting a metallic buffer layer 18 between Hk enhancing layer 15 and the capping layer. Otherwise, all aspects previously described with respect to p-MTJ 1 are retained in p-MTJ 2 with sidewall 2s. It is believed that the metal lattice in the buffer layer, which is also known as a dusting layer, absorbs or reacts with nitrogen rather than allow diffusion to the Hk enhancing layer and beyond. Preferably, the dusting layer is one or more of the M1 elements described earlier that has a lower affinity for oxygen than Mg, and more preferably, has an oxygen affinity less than that of Ti according to FIG. 10. The metallic buffer layer is also conductive to prevent an undesirable increase in $RA_{TOTAL}$. In some embodiments, the metallic buffer layer has a thickness from 0.3 to 30 Angstroms. Preferably, the metallic buffer layer has a minimum thickness of about 3 Angstroms that is required to form a continuous film. Thus, the metallic buffer layer/capping layer stack according to the second embodiment may have a M1/M1N, M1/M1ON, M1/M2M3N, or M1/M2M3ON configuration.

It should be understood that in all exemplary embodiments illustrated herein, the p-MTJ sidewall is substantially orthogonal to BE top surface 10t. In other embodiments, the p-MTJ sidewall may form an angle between 65 and 90 degrees with respect to top surface 10t depending on the RIE or IBE conditions employed to generate the sidewall during pattern formation of the p-MTJ.

Figure 3:
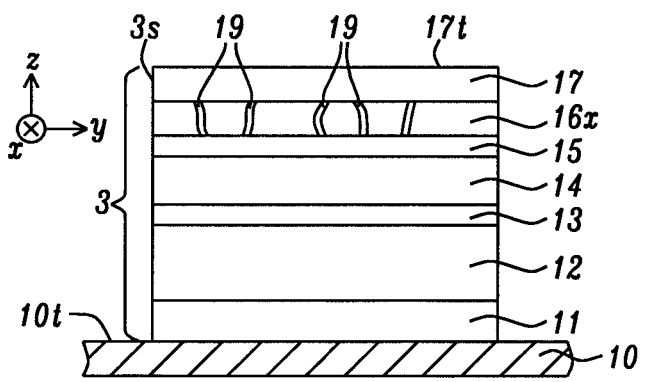
FIG. 3 is a cross-sectional view of a p-MTJ comprised of a nitride capping layer in which conductive current pathways are formed between a Hk enhancing layer and hard mask according to a third embodiment of the present disclosure.

The present disclosure also encompasses a third embodiment depicted in FIG. 3 where p-MTJ 3 having sidewall 3s is a modification of p-MTJ 2. In particular, the M3 metal or alloy forms conductive pathways 19 in an insulating M2N or M2ON matrix 16x rather than forming an alloy with the M2 nitride or M2 oxynitride. This approach is desirable when M3 does not form an alloy with a M2 nitride or oxynitride, or if the maximum M3 content in M2M3N or M2M3ON capping layer is not sufficient to generate acceptable conductivity (minimal RA). A method of making conductive paths in the M2N or M2ON matrix is provided in a later section. Conductive pathways may have dimension (width) in the in-plane direction that varies from a single atom to a plurality of atoms. Preferably, each pathway extends from the Hk enhancing layer 15 to the hard mask 17. Furthermore, the pathways are not necessarily orthogonal to the substrate 10, but may have an in-plane component in addition to a substantially vertical or perpendicular-to-plane direction.

Figure 4:
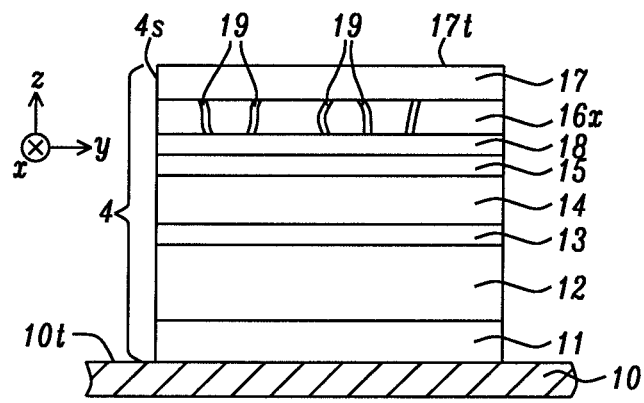
FIG. 4 is a cross-sectional view of the p-MTJ in FIG. 3 that is modified to include a buffer layer between the Hk enhancing layer and nitride capping layer according to a fourth embodiment of the present disclosure.

According to a fourth embodiment shown in FIG. 4 where p-MTJ 4 has sidewall 4s, the p-MTJ in the third embodiment is modified to include metallic buffer layer 18 described previously with respect to the second embodiment. Again, the buffer layer is beneficial in substantially reducing nitrogen migration from a metal M2 nitride or oxynitride portion of capping layer 16x to Hk enhancing layer 15 and FL 14. All aspects of the buffer layer including thickness and M1 metal composition are retained from the second embodiment.

Figure 5:
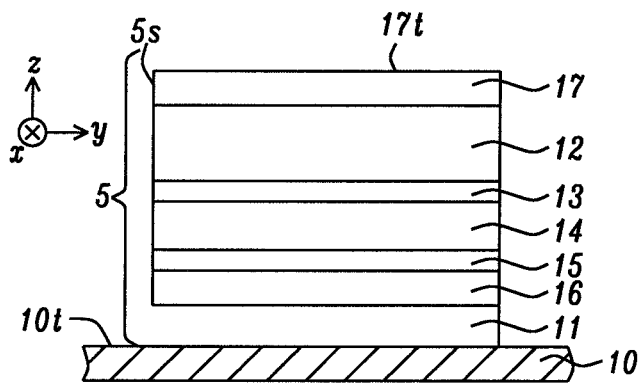
FIG. 5 is a cross-sectional view of a p-MTJ with a top spin valve configuration wherein a nitride barrier layer is formed between a seed layer and a Hk enhancing layer according to a fifth embodiment of the present disclosure.

In a fifth embodiment depicted in FIG. 5, the bottom spin valve configuration in FIG. 1 is modified by retaining all of the p-MTJ layers, but the order of deposition is changed to yield a p-MTJ 5 with sidewall 5s and having a top spin valve configuration wherein seed layer 11, barrier layer 16, Hk enhancing layer 15, FL 14, tunnel barrier 13, pinned layer 12, and hard mask 17 are sequentially formed on BE 10. The FL continues to have a first interface with the tunnel barrier layer and a second interface with the Hk enhancing layer to enhance PMA in the FL. In this case, when the pinned layer has a SyAP configuration (not shown), the inner AP1 layer contacts a top surface of the tunnel barrier layer and the outer AP2 layer adjoins a bottom surface of the hard mask. Note that for all top spin valve embodiments, the term "capping layer" is replaced with "barrier layer" since layer 16 is no longer above the FL and Hk enhancing layer, but below said layers.

Figure 6:
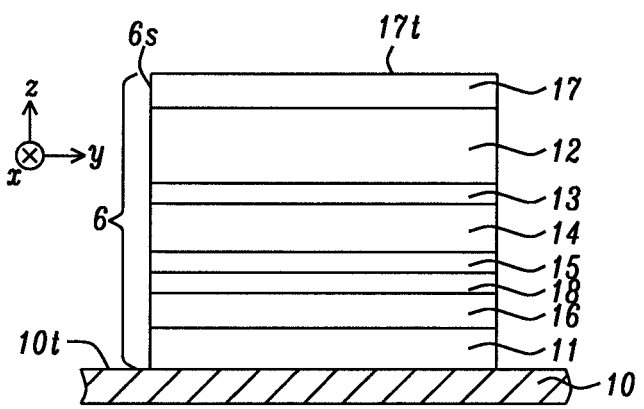
FIG. 6 is a cross-sectional view of the p-MTJ in FIG. 5 that is modified to include a buffer layer between the nitride barrier layer and Hk enhancing layer according to a sixth embodiment of the present disclosure.

A sixth embodiment is depicted in FIG. 6 where all layers in p-MTJ 2 are retained but stacked in a different order to yield p-MTJ 6 with sidewall 6s and having a top spin valve configuration. In particular, metallic buffer layer 18 is inserted between barrier layer 16 and Hk enhancing layer 15 to reduce nitrogen diffusion from a M1N, M1ON, M2M3N, or M2M3ON barrier layer into the Hk enhancing layer and FL. As a result, seed layer 11, barrier layer 16, buffer layer 18, Hk enhancing layer 15, FL 14, tunnel barrier layer 13, pinned layer 12, and hard mask 17 are sequentially formed on BE 10.

Figure 7:
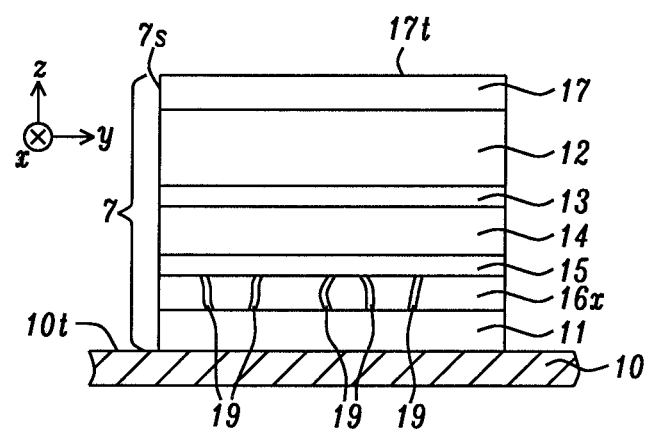
FIG. 7 is a cross-sectional view of a p-MTJ with a top spin valve configuration wherein a nitride barrier layer with current conducting paths therein is formed between a seed layer and a Hk enhancing layer according to a seventh embodiment of the present disclosure.

In the seventh embodiment shown in FIG. 7, p-MTJ 3 in FIG. 3 is reconfigured to provide p-MTJ 7 with sidewall 7s where seed layer 11, insulating matrix 16x having conductive paths 19 formed therein, Hk enhancing layer 15, FL 14, tunnel barrier layer 13, pinned layer 12, and hard mask 17 are sequentially formed on BE 10.

Figure 8:
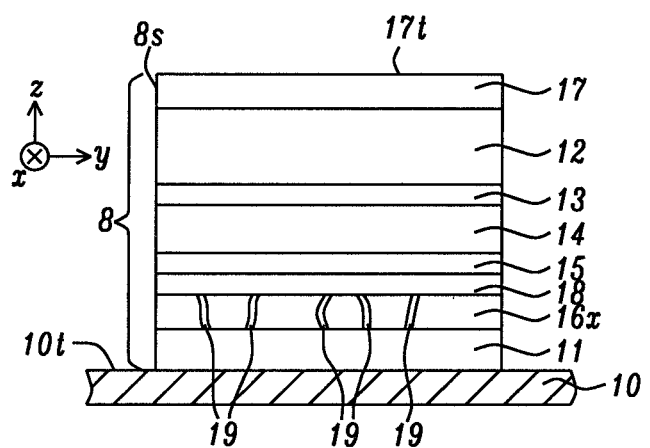
FIG. 8 is a cross-sectional view of the p-MTJ in FIG. 7 that is modified to include a buffer layer between the Hk enhancing layer and nitride barrier layer according to an eighth embodiment of the present disclosure.

According to an eighth embodiment shown in FIG. 8 where p-MTJ 8 has sidewall 8s, the p-MTJ in the seventh embodiment is modified to include metallic buffer layer 18 described previously. The buffer layer is beneficial in substantially reducing nitrogen migration from a metal M2 nitride or oxynitride portion of insulating matrix 16x to Hk enhancing layer 15 and FL 14. All aspects of the buffer layer including thickness and M1 metal composition are retained from the sixth embodiment.

The present disclosure also encompasses a method of fabricating a p-MTJ cell described herein. All layers in the p-MTJ cells described herein may be formed in an Anelva C-7100 thin film sputtering system or the like which typically includes multiple physical vapor deposition (PVD) chambers each with a capability for five targets, an oxidation chamber, and a sputter etching chamber. Usually, the sputter deposition process comprises a noble gas such as argon, and oxygen is excluded unless required for tunnel barrier or Hk enhancing layer formation in the oxidation chamber. Once all of the layers in the p-MTJ stack are laid down on the bottom electrode, high temperature annealing may be performed in a vacuum oven for 1 to 5 hours at a temperature of about 360° C. to 400° C. to transform the amorphous tunnel barrier and Hk enhancing layer, and amorphous FL into crystalline layers for lattice matching in the tunnel barrier/FL/Hk enhancing layer stack to enhance DRR.

Thereafter, an array of p-MTJ cells may be fabricated by a process involving a conventional photolithography patterning process and reactive ion etch (RIE) and/or ion beam etch (IBE) processes well known in the art. Subsequently, an encapsulation layer (not shown) is deposited to electrically insulate p-MTJ cells. A chemical mechanical polish (CMP) process is typically employed to form a smooth surface on the encapsulation layer that becomes coplanar with a top surface of the hard mask in each p-MTJ cell. Then a top electrode array (not shown) including a plurality of conductive lines (i.e. bit lines or word lines) is formed on the p-MTJ array and encapsulation layer to continue the magnetic device fabrication. During a read or write operation, a current is passed through the p-MTJ from the BE to a top conductive line, or in the reverse direction.

Figure 11:
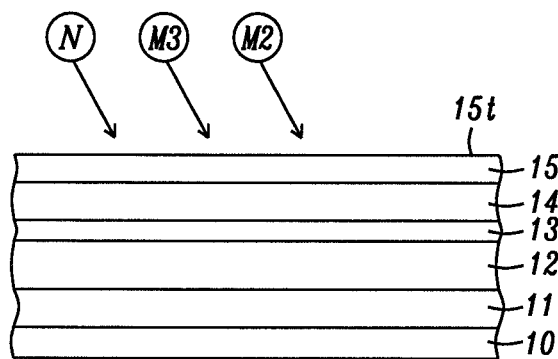
FIGS. 11-14 are cross-sectional views depicting various methods of forming conductive pathways within a metal nitride or metal oxynitride matrix according to an embodiment of the present disclosure.

With regard to the formation of conductive pathways 19 in a metal nitride or metal oxynitride matrix 16x shown in FIGS. 3-4, a method similar to that described for forming a doped metal oxide layer in related application Ser. No. 15/728,818 may be employed. According to one embodiment depicted in FIG. 11, conductive pathways made of the M3 metal or alloy are formed in a M2N matrix in a reactive gas environment generated by a chemical vapor deposition (CVD), physical vapor deposition (PVD), or a plasma enhanced CVD (PECVD) method wherein the M3 species, M2 species, and nitrogen species N are simultaneously directed at top surface 15t of Hk enhancing layer 15, and react to form a film thereon. The conductive pathways may be formed during the CVD, PVD, or PECVD process, or during a subsequent anneal step that promotes M3 diffusion and conglomeration. It should be understood that the reactive gas environment further includes oxygen species when a M2ON matrix is desired.

Figure 12:
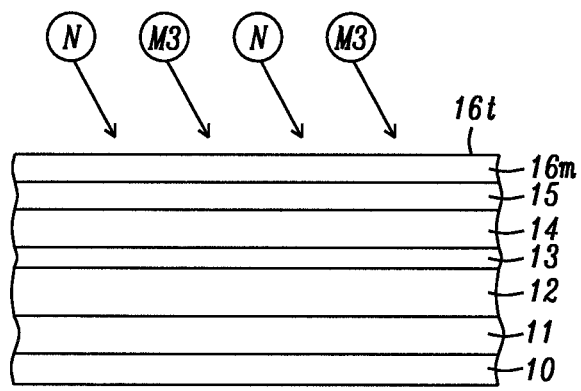

According to a second embodiment shown in FIG. 12, a M2 layer 16m with top surface 16t is deposited on the Hk enhancing layer 15 during a first step. Then, a second step is performed where the reactive gas environment mentioned in the previous embodiment is limited to nitrogen species N and the M3 species thereby affording conductive M3 channels 19 in a M2N matrix 16x, or is limited to N, O, and M1 species to form M3 channels in a M2ON matrix in FIG. 3. Alternatively, the M2 layer may be initially deposited on the metallic buffer layer (not shown) followed by the second step with the N and M3 species (or N, O, and M1 species) to yield conductive M3 channels in a M2N or M2ON matrix, respectively, in FIG. 4.

Figure 13:
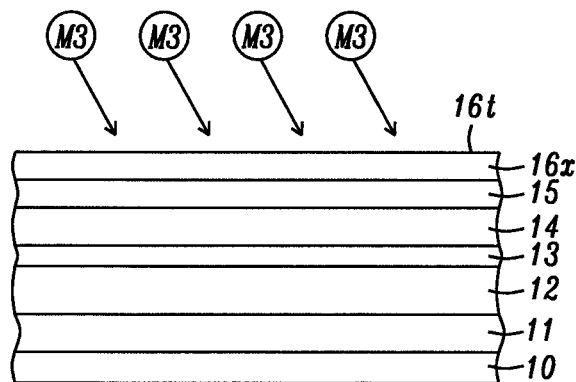

A third embodiment is shown in FIG. 13 where a M2N or M2ON layer 16x is deposited on the Hk enhancing layer. Thereafter, a reactive gas environment comprised of M3 species is generated and reacts with layer 16x to provide conductive channels 19 therein as indicated in FIG. 3. Alternatively, the method illustrated in FIG. 13 represents an ion implantation of M3 species into the M2N or M2ON layer. One or more anneal steps may then be used to form conductive M3 channels.

Figure 14:
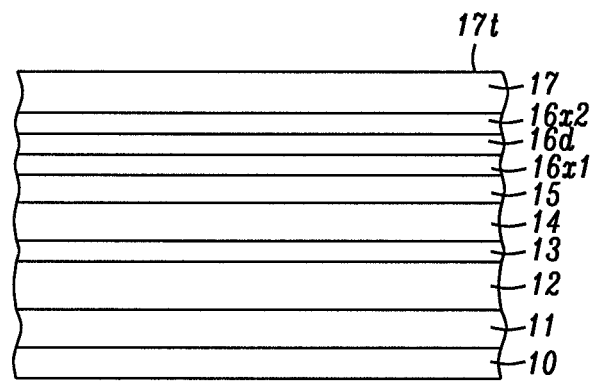

In yet another embodiment depicted in FIG. 14, a trilayer stack of layers 16x1/16d/16x2 is formed on the Hk enhancing layer followed by deposition of hard mask 17. Note that layers 16x1, 16x2 are M2N or M2ON layers while layer 16d is a M3 layer. Optionally one of the 16x1 and 16x2 layers may be omitted to provide a bilayer stack. Thereafter, one or more anneal steps results in diffusion of M3 into the M2N or M2ON layer(s) to form conductive channels 19 in the M2N or M2ON matrix 16x shown in FIG. 3.

In all embodiments, the p-MTJ 1-8 is patterned by a conventional sequence involving formation of a pattern in a photoresist mask (not shown) on a top surface 17t of the hard mask, and then employing one or more IBE or RIE steps to transfer the pattern through the p-MTJ stack to form sidewalls 1s-8s, respectively.

Figure 15:
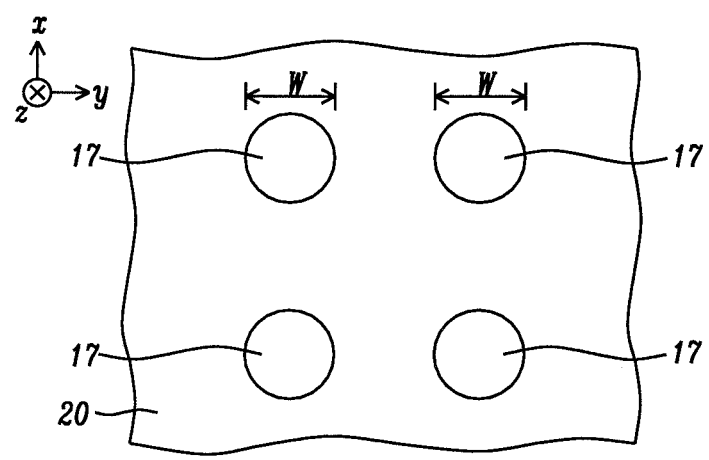
FIG. 15 is a top-down view of a memory array wherein a plurality of p-MTJ cells is insulated by an encapsulation layer according to an embodiment of the present disclosure.

FIG. 15 is a top-down view after patterning the p-MTJ stack with uppermost layer 17, and depositing and planarizing encapsulation layer 20 to insulate adjacent p-MTJs in an array of rows and columns. In the exemplary embodiment, each p-MTJ has a circular shape with a critical dimension w that may be <100 nm. In other embodiments, each p-MTJ may have an elliptical or polygonal shape.

Figure 9A:
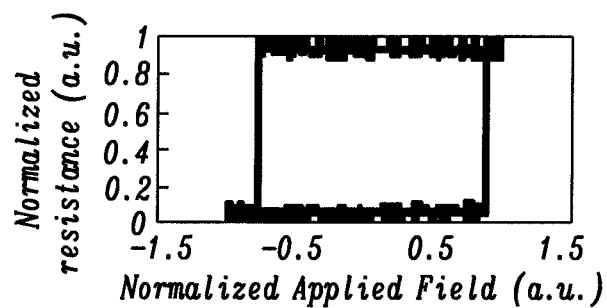
FIGS. 9a-9d are plots showing hysteresis loops measured for a p-MTJ having different nitride barrier layers between a Hk enhancing layer and hard mask, and formed according to an embodiment of the present disclosure.
Figure 9B:
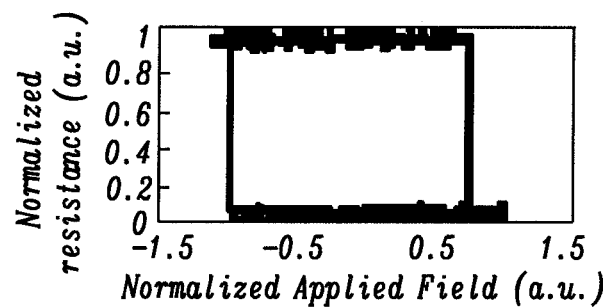
Figure 9C:
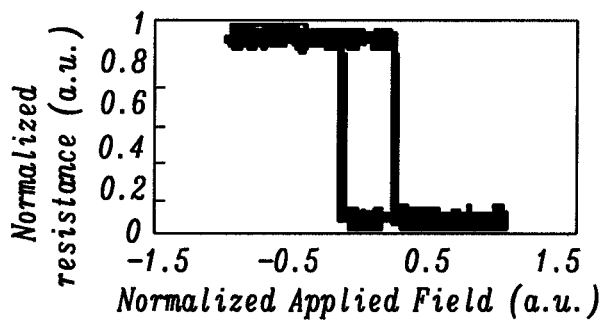
Figure 9D:
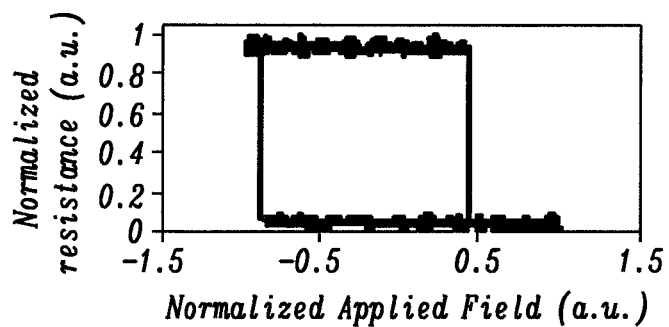

The performance of incorporating a metal nitride layer in a p-MTJ according to an embodiment of the present disclosure was determined by first forming a p-MTJ stack of layers in which a CoFeB pinned layer, MgO tunnel barrier layer, CoFeB FL, MgO Hk enhancing layer, and the metal nitride layer were deposited on a substrate. Hysteresis loops were measured for the patterned p-MTJ stacks at room temperature and shown in FIG. 9a for the reference TiN capping layer disclosed in related application Ser. No. 15/461,779, and in FIGS. 9b-9d for MoN, WN, and AlN layers, respectively, formed according to the first embodiment and depicted in FIG. 1. All examples show PMA in the FL, and sharp switching. Each p-MTJ was circular with a 100 nm width and the target thickness of the metal nitride capping layer is 30 Angstroms.

In a second experiment, a 5+/−1.6 Angstrom thick Mo buffer layer was inserted between the M1N capping layer with a 30 Angstrom target thickness and a MgO Hk enhancing layer in a p-MTJ according to a second embodiment of the present disclosure shown in FIG. 2. The results of the experiment are summarized in Table 1 below. Note that the thickness for the non-TiN capping layers has not been optimized, and further study is expected to provide one or more of enhanced DRR, greater Hc, and lower RA with respect to a TiN capping layer. The normalized Hc column shows the best Hc observed for a p-MTJ with a Mo/M1N stack but may not correspond to the example providing the maximum DRR.

TABLE 1

Magnetic Properties of p-MTJ with a seed/CoFeB/MgO/CoFeB/MgO/buffer/capping layer configuration

| Capping layer | Normalized maximum DRR | Normalized Rp (max DRR) | Normalized Vc (max DRR) | Normalized Hc (best) |
|---|---|---|---|---|
| ZrN 30 | 1.08 | 1.22 | 0.95 | 0.31 |
| TiN 30 | 1.00 | 1.00 | 1.00 | 1.00 |
| MoN 30 | 0.99 | 1.71 | 0.84 | 0.24 |
| NbN 30 | 1.03 | 1.30 | 0.99 | 0.41 |

We confirmed that incorporating a metallic buffer layer between a metal nitride (M1N) capping layer and a MgO Hk enhancing layer according to the second embodiment in FIG. 2 was effective in reducing interdiffusion between M1N and MgO. In particular, when a Mo buffer layer was inserted between the MgO Hk enhancing layer and a 30 Angstrom thick TiN layer, DRR increased by 10% compared with the prior art MgO/TiN stack. Furthermore, when the Mo buffer layer is inserted between the MgO Hk enhancing layer and a 30 Angstrom thick MoN capping layer according to the second embodiment, a 3% increase in DRR is realized compared with a MoN capping layer with no buffer layer.

Note that all results in Table 1 are normalized and compared with a relative value of 1.00 for a TiN capping layer. Rp relates to $RA_{TOTAL}$, Vc is a measure of the switching voltage, and Hc is coercivity.

All of the embodiments described herein may be incorporated in a manufacturing scheme with standard tools and processes. A considerable gain in overall magnetic performance is achieved in that higher DRR and FL PMA as well as fewer electrical shorts are observed while maintaining or lowering RA to further improve 64 Mb and 256 Mb STT-MRAM technology, and related spintronic devices where switching current, RA, DRR, FL PMA, and thermal stability are all critical parameters. A reduction in electrical shorts leads to greater device yield and lower fabrication cost because of more usable parts per unit of production time. We have observed that the percentage of good devices (80 nm p-MTJ cells) increases significantly from 6% to 26% when a MoN capping layer according to the first embodiment is used instead of a TiN capping layer that was previously disclosed in related application Ser. No. 15/461,779.

While the present disclosure has been particularly shown and described with reference to, the preferred embodiment thereof, it will be understood by those skilled in the art that various changes in form and details may be made without departing from the spirit and scope of this disclosure.

What is claimed is:

1. A perpendicular magnetic tunnel junction (p-MTJ) structure, comprising:
 a tunnel barrier layer that is a first metal oxide layer;
 a Hk enhancing layer that includes a material layer selected from the group consisting of a second metal oxide layer and a first metal oxynitride layer;
 a free layer;
 a second metal oxynitride layer; and
 a buffer layer having a first surface that physically contacts the Hk enhancing layer and a second surface that physically contacts the second metal oxynitride layer.

2. The p-MTJ structure of claim 1, wherein the second metal oxynitride layer has a M1ON composition, wherein M1 is a metal or alloy that includes a material selected from the group consisting of Ti, V, Cr, Zr, Nb, Mo, Hf, Ta, and W.

3. The p-MTJ of claim 1, wherein the second metal oxynitride layer has a M2M3ON composition, wherein M2 is selected from the group consisting of B, Al, Si, Ga, In and Tl, and wherein M3 is selected from the group consisting of Pt, Au, Ag, Mg, Ca, Sr, Ba, Sc, Y, La, Co, Fe, Mn, Ru, Rh, Ir, Ni, Pd, Zn, Cu, Ti, V, Cr, Zr, Nb, Mo, Hf, Ta and W.

4. The p-MTJ of claim 1, wherein the second metal oxynitride layer is comprised of a M2ON matrix having conductive paths of a M3 metal formed therein, wherein M2 is selected from the group consisting of B, Al, Si, Ga, In, and Tl, and wherein M3 is selected from the group consisting of Pt, Au, Ag, Mg, Ca, Sr, Ba, Sc, Y, La, Co, Fe, Mn, Ru, Rh, Ir, Ni, Pd, Zn, Cu, Ti, V, Cr, Zr, Nb, Mo, Hf, Ta, and W.

5. The p-MTJ structure of claim 1, further comprising an electrode layer, and
 wherein the electrode layer physically contacts the second metal oxynitride layer.

6. The p-MTJ structure of claim 1, further comprising a seed layer, and
 wherein the seed layer physically contacts the second metal oxynitride layer.

7. The p-MTJ structure of claim 1, wherein the buffer layer includes a metal material.

8. The p-MTJ structure of claim 1, wherein the tunnel barrier layer physically contacts the free layer, and wherein the Hk enhancing layer physically contacts the free layer.

9. A perpendicular magnetic tunnel junction (p-MTJ) structure, comprising:
a tunnel barrier layer that is a first metal oxide layer;
a Hk enhancing layer that includes a material layer selected from the group consisting of a second metal oxide layer and a first metal oxynitride layer;
a free layer; and
a second metal oxynitride layer, wherein the second metal oxynitride layer is comprised of a M2ON matrix having conductive paths of a M3 metal formed therein, wherein M2 is a different metal than M3.

10. The p-MTJ structure of claim 9, further comprising a buffer layer disposed between the Hk enhancing layer and the second metal oxynitride layer.

11. The p-MTJ structure of claim 10, wherein the buffer layer physically contacts the Hk enhancing layer and the second metal oxynitride layer.

12. The p-MTJ structure of claim 10, wherein the buffer layer includes a metal material.

13. The p-MTJ structure of claim 9, wherein M2 is selected from the group consisting of B, Al, Si, Ga, In, and Tl, and wherein M3 is selected from the group consisting of Pt, Au, Ag, Mg, Ca, Sr, Ba, Sc, Y, La, Co, Fe, Mn, Ru, Rh, Ir, Ni, Pd, Zn, Cu, Ti, V, Cr, Zr, Nb, Mo, Hf, Ta, and W.

14. The p-MTJ of claim 9, wherein the free layer includes a material selected from the group consisting of Co, Fe, CoFe, CoFeB, CoB, FeB, CoFeNi, and CoFeNiB, and alloys thereof.

15. The p-MTJ of claim 9, wherein the free layer includes a material selected from the group consisting of a Heusler alloy and a rare-earth alloy.

16. The p-MTJ of claim 9, wherein the metal in the second metal oxide layer or the first metal oxynitride layer is one or more of Mg, Si, Ti, Ba, Ca, La, Al, Mn, V, and Hf.

17. A method of forming a perpendicular magnetic tunnel junction (p-MTJ), comprising:
forming a tunnel barrier layer on a substrate;
forming a free layer on the tunnel barrier layer;
forming a Hk enhancing layer on the free layer, the Hk enhancing layer including a metal oxide layer or a first metal oxynitride layer;
forming a metallic buffer layer on the Hk enhancing layer; and
forming a capping layer on the metallic buffer layer the capping layer including a metal nitride layer or a second metal oxynitride layer.

18. The method of claim 17, wherein the metal nitride or second metal oxynitride layer has a M1N or M1ON composition, wherein M1 is a metal or alloy that includes a material selected from the group consisting of Ti, V, Cr, Zr, Nb, Mo, Hf, Ta, and W.

19. The method of claim 17, wherein the metal nitride or second metal oxynitride layer has a M2M3N or M2M3ON composition, wherein M2 is selected from the group consisting of B, Al, Si, Ga, In and Tl, and wherein M3 is selected from the group consisting of Pt, Au, Ag, Mg, Ca, Sr, Ba, Sc, Y, La, Co, Fe, Mn, Ru, Rh, Ir, Ni, Pd, Zn, Cu, Ti, V, Cr, Zr, Nb, Mo, Hf, Ta and W.

20. The method of claim 17, wherein the metal nitride or second metal oxynitride layer is comprised of a M2N or M2ON matrix having conductive paths of a M3 metal formed therein, wherein M2 is selected from the group consisting of B, Al, Si, Ga, In, and Tl, and wherein M3 is selected from the group consisting of Pt, Au, Ag, Mg, Ca, Sr, Ba, Sc, Y, La, Co, Fe, Mn, Ru, Rh, Ir, Ni, Pd, Zn, Cu, Ti, V, Cr, Zr, Nb, Mo, Hf, Ta, and W.

* * * * *